United States Patent
Hayashi et al.

(10) Patent No.: US 6,762,825 B2
(45) Date of Patent: Jul. 13, 2004

(54) FOCAL POINT POSITION DETECTING METHOD IN SEMICONDUCTOR EXPOSURE APPARATUS

(75) Inventors: Nozomu Hayashi, Utsunomiya (JP); Hiroshi Tanaka, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/241,533

(22) Filed: Sep. 12, 2002

(65) Prior Publication Data
US 2003/0053040 A1 Mar. 20, 2003

(30) Foreign Application Priority Data
Sep. 13, 2001 (JP) ......................................... 2001-278107

(51) Int. Cl.[7] .......................... G03B 27/52; G01B 11/14
(52) U.S. Cl. ......................................... 355/55; 356/624
(58) Field of Search ................................ 356/123, 125, 356/609, 624; 355/53, 55, 77; 250/492.2

(56) References Cited

U.S. PATENT DOCUMENTS

| | | | | |
|---|---|---|---|---|
| 5,496,669 A | * | 3/1996 | Pforr et al. ..................... | 430/22 |
| 5,929,978 A | * | 7/1999 | Masaki .......................... | 355/53 |
| 6,118,516 A | * | 9/2000 | Irie et al. ....................... | 355/53 |
| 6,385,497 B1 | * | 5/2002 | Ogushi et al. ............... | 700/110 |

OTHER PUBLICATIONS

Eugene Hecht, Optics 1998, Addison Wesley, 544–546.*

* cited by examiner

Primary Examiner—Russell Adams
Assistant Examiner—D. Ben Esplin
(74) Attorney, Agent, or Firm—Fitzpatrick, Cella, Harper & Scinto

(57) ABSTRACT

A method of detecting a focal point position of a projection optical system. The method includes moving an object having a first mark in a direction of an optical axis of the projection optical system, illuminating the first mark with light, taking an image of the illuminated first mask through the projection optical system, using an image pickup unit, with respect to each position of the object, calculating a contrast-related value relating to contrast of a first signal corresponding to the first mark in each of the images, measuring an intensity of the light with respect tot each of the images, based on a second signal different from the first signal, correcting the contrast-related value of each of the images, based on the corresponding intensity of the light, and detecting the focal point position, based on the corrected contrast-related value of each of the images.

16 Claims, 10 Drawing Sheets

FOCAL POINT POSITION DETECTING METHOD IN SEMICONDUCTOR EXPOSURE APPARATUS

FIELD OF THE INVENTION AND RELATED ART

This invention relates to a focal point position detecting method and detecting system suitably usable in a reduction projection exposure apparatus for the manufacture of semiconductor devices, for measuring a focal point position of a projection optical system.

In semiconductor manufacturing exposure apparatuses, the focal point position of a projection optical system is detected generally as follows. In FIG. 6, denoted at RS is a reticle stage, and denoted at R is a reticle. Denoted at RM is a reticle mark, and denoted at W is a wafer, which is a substrate to be exposed. Denoted at 1 is a projection optical system. Also, denoted at S is a focal point position detecting optical system, and denoted at 2 is focal point position detecting illuminating means. Denoted at 3 is a beam splitter, and denoted at 4 and 5 are imaging optical systems. Denoted at 6 is image pickup means, and denoted at 7 is analog-to-digital (A/D) converting means. Denoted at 8 is integration means, and denoted at 9 is contrast calculating means. Denoted at 10 is stage driving means, and denoted at 11 is a stage which is movable three-dimensionally. Denoted at 12 and 13 are imaging optical systems, and denoted at 14 is Z-axis position measuring illuminating means. Denoted at 15 is image pickup means, and denoted at 16 is analog-to-digital (A/D) converting means. Denoted at 17 is integration means, and denoted at 18 is Z-axis position measuring means. The components from the imaging optical system to the Z-axis position measuring means 18, inclusive, are used for Z-axis position measurement.

The process for detecting the focal point position is as follows.

First, the stage is moved to a position where a focal point position detecting mark provided on the stage can be observed. Initially, by use of a light beam emitted from the focal point position detecting illuminating means 2, which projects exposure light, the focal point position detecting mark (hereinafter, reference mark SM) is illuminated through the beam splitter 3, the reticle R and the projection optical system 1. FIG. 2A shows an image of the reference mark SM, and, in this example, it comprises plural patterns of the same shape. Light reflected by the reference mark SM goes through the projection optical system 1 and the reticle R once again, and it impinges on the beam splitter 3 and is reflected thereby. Then, through the imaging optical system 5, an image of the reference mark SM is formed on an image pickup surface Wp of the image pickup means 6. The image of the reference mark SM is then photoelectrically converted by the image pickup means 6. Thereafter, the A/D converting means 7 processes its output into a two-dimensional digital signal train. Denoted 8 in the drawing is integration means which performs integration processing with respect to the Y direction in FIG. 2A and functions to transform a two-dimensional signal into a one-dimensional digital signal train S(x). By using the thus transformed digital signal train, the contrast calculating means 9 measures the contrast within the range of a reference mark measuring window WSM at the reference mark portion. The operation described above is carried out plural times, while changing the position of the stage within a Z-axis range being expected to include the focus of the projection optical system 1. Then, a graph is plotted, as shown in FIG. 4A, while taking the axis of the abscissa for the Z-axis position and the axis of the ordinate for the reference mark contrast level. Around a maximum contrast level portion, the Z-axis position which provides the largest contrast level is detected by means of curve fitting or gravity center calculation, for example. The thus detected position is taken as the focal point position (best focus) of the projection optical system.

The focal point position detecting method described above is particularly effective in an apparatus wherein precise detection of focal point position is required.

However, when images of the reference mark are picked up at different stage positions, the intensity of illumination light may not be constant as shown in FIG. 3A. With the elapse of time within the image storage time, the intensity might change slightly or, alternatively, it might fluctuate (FIG. 3B). If this occurs, the contrast is influenced by the variation in light intensity, such that the graph of Z-axis position versus contrast level cannot be produced correctly. As a result, the detected focal point position contains an error.

In order to avoid such inconveniences, there may be a method for improving the stability of the light source and a method in which a system for monitoring the light quantity is incorporated into the illumination system. However, in order to increase the light source stability, the precision of the illumination system has to be improved, and it makes the system very complicated and expensive. On the other hand, the method for monitoring the light quantity makes the measuring system very complicated, in the point that it requires a light quantity monitor in addition to a mark image-taking camera and that the measurements should be done at the same timing.

SUMMARY OF THE INVENTION

It is accordingly an object of the present invention to provide a focal point position detecting method and a focal point position detecting system by which, even if the intensity of illumination light changes when a reference mark is to be image-taken at different positions of a stage, the influence upon the detection of focal point position is reduced and also the measurement can be done simply without complications.

In accordance with an aspect of the present invention, there is provided a method of detecting a focal point position, comprising the steps of: moving an object having a mark, in an optical axis direction of a projection optical system; illuminating, with respect to different movement positions of the object, the mark of the object through the projection optical system and taking an image of the mark to produce imagewise information; correcting the imagewise information in accordance with an intensity of light illuminating the mark; and detecting a focal point position of the projection optical system on the basis of the imagewise information corrected with respect to each of the different movement positions of the object.

In one preferred form of this aspect of the present invention, the object is provided with plural marks each being as aforesaid.

The light intensity may be measured by use of light quantity measuring means.

The light intensity may be based on light reflected by a mark separate from the mark of the object.

The light quantity measuring means may be provided on a stage for carrying the object thereon.

The imagewise information may contain a contrast level of the mark image.

The contrast level of the mark image may be corrected in accordance with [contrast level]/[light intensity].

The focal point position detecting process may be repeated again when the light intensity at a movement position of the object is out of a predetermined range.

At an initial movement position of the object, the image-taking for the mark image and the measurement of the light intensity may be carried out plural times, and, after dispersion or variance of the light intensity is converged to a predetermined range, the focal point position detection may be initiated.

In accordance with another aspect of the present invention, there is provided a focal point position detecting system, comprising: moving means for moving an object having a mark, in an optical axis direction of a projection optical system; producing means for illuminating, with respect to different movement positions of the object, the mark of the object through the projection optical system and taking an image of the mark to produce imagewise information; correcting means for correcting the imagewise information in accordance with an intensity of light illuminating the mark; and detecting means for detecting a focal point position of the projection optical system on the basis of the imagewise information corrected with respect to each of the different movement positions of the object.

In one preferred form of this aspect of the present invention, the object is provided with plural marks each being as aforesaid.

The apparatus may further comprise light quantity measuring means for measuring the light intensity.

The light intensity may be based on light reflected by a mark separate from the mark of the object.

The light quantity measuring means may be provided on a stage for carrying the object thereon.

The imagewise information may contain a contrast level of the mark image.

The contrast level of the mark image may be corrected in accordance with [contrast level]/[light intensity].

The focal point position detecting process may be repeated again when the light intensity at a movement position of the object is out of a predetermined range.

At an initial movement position of the object, the image-taking for the mark image and the measurement of the light intensity may be carried out plural times, and, after dispersion or variance of the-light intensity is converged to a predetermined range, the focal point position detection may be initiated.

In accordance with a further aspect of the present invention, there is provided an exposure apparatus for transferring a pattern of an original onto a substrate through a projection optical system, said apparatus comprising: moving means for moving a substrate having a mark, in an optical axis direction of the projection optical system; producing means for illuminating, with respect to different movement positions of the substrate, the mark of the substrate through the projection optical system and taking an image of the mark to produce imagewise information; correcting means for correcting the imagewise information in accordance with an intensity of light illuminating the mark; and detecting means for detecting a focal point position of the projection optical system on the basis of the imagewise information corrected with respect to each of the different movement positions of the substrate.

In accordance with a yet further aspect of the present invention, there is provided a semiconductor device manufacturing method, comprising the steps of: providing a group of production machines for performing various processes, including an exposure apparatus, in a semiconductor manufacturing factory; and producing a semiconductor device through plural processes using the production machine group.

In one preferred form of this aspect of the present invention, the method further comprises (i) connecting the production machines of the group with each other through a local area network, and (ii) executing data-communication concerning information related to at least one production machine of the production machine group, between the local area network and an external network outside the semiconductor manufacturing factory.

A database provided by a vendor or a user of the exposure apparatus can be accessed through the external network so that maintenance information related to the production machine can be obtained through the data communication, and production control can be performed on the basis of data communication made through the external network and between the semiconductor factory and a separate semiconductor factory.

In accordance with a still further aspect of the present invention, there is provided a semiconductor manufacturing factory, comprising: a group of production machines for performing various processes, including an exposure apparatus as recited above; a local area network for connecting the production machines of the production machine group with each other; and a gateway for enabling an access from the local area network to an external network outside the factory, wherein information related to at least one production machine in the group can be data communicated by use of the local area network and the gateway.

In accordance with a yet further aspect of the present invention, there is provided a method of executing maintenance for an exposure apparatus as recited above, said method comprising the steps of: preparing, by a vendor or a user of the exposure apparatus, a maintenance database connected to an external network outside the semiconductor manufacturing factory, admitting an access from the semiconductor manufacturing factory to the maintenance database through the external network; and transmitting maintenance information stored in the maintenance database to the semiconductor manufacturing factory through the external network.

The exposure apparatus as recited above may further comprise a display, a network interface and a computer for executing network software, wherein maintenance information related to said exposure apparatus is data communicated through the computer network.

The network software may provide on the display a user interface for accessing a maintenance database prepared by a vendor or a user of said exposure apparatus and connected to an external network outside a factory where said exposure apparatus is placed, thereby to enable obtaining information from the database through the external network.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 2A and 2B illustrate an example of a mark image pickup, wherein FIG. 2A shows images of a reference mark and a reticle mark, and FIG. 2B shows ranges for a referenced mark measuring window and a reticle mark measuring window in relation to the X-axis position and the intensity of illumination light.

FIGS. 3A and 3B illustrate changes in Z-axis position and the light quantity in image pickup, wherein FIG. 3A shows the relation between the time and the Z-axis position and FIG. 3B shows the relation between the time and the light quantity in image pickup.

DESCRIPTION OF THE PREFERRED EMBODIMENTS

Preferred embodiments of the present invention will now be described with reference to the attached drawings.
[First Embodiment]

A semiconductor manufacturing exposure apparatus in a first embodiment of the present invention will be described.

Figure 1:
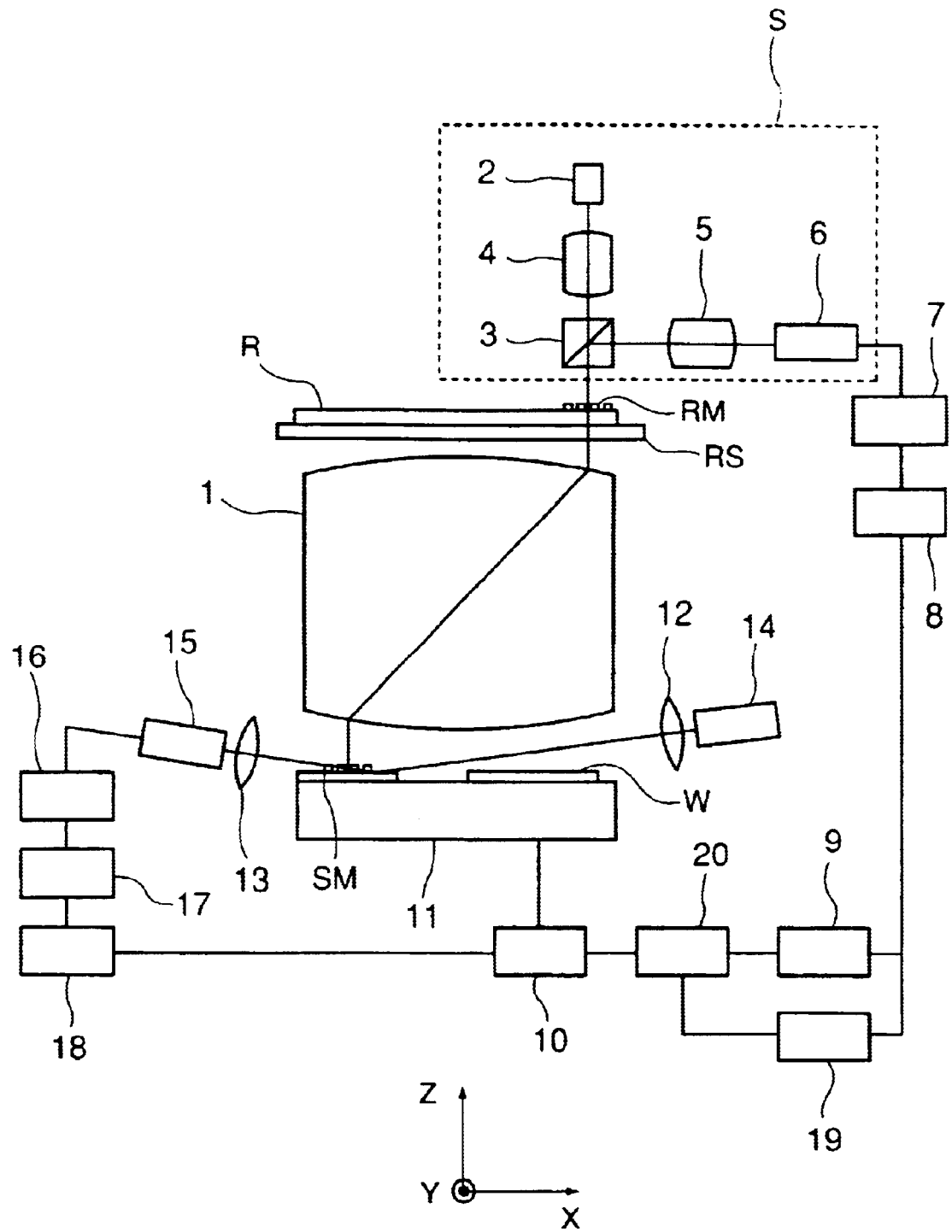
FIG. 1 is a schematic view of a typical example of a semiconductor manufacturing exposure apparatus having a focal point position detecting system according to an embodiment of the present invention.

In FIG. 1, denoted at RS is a reticle stage, and denoted at R is a reticle. Denoted at RM is a reticle mark, and denoted at W is a wafer which is a substrate (plane object) to be exposed. Denoted at 1 is a projection optical system. Also, denoted at S is a focal point position detecting optical system, and denoted at 2 is focal point position detecting illuminating means. Denoted at 3 is a beam splitter, and denoted at 4 and 5 are imaging optical systems. Denoted at 6 is image pickup means, and denoted at 7 is analog-to-digital (A/D) converting means. Denoted at 8 is integration means, and denoted at 9 is contrast calculating means. Denoted at 10 is stage driving means, and denoted at 11 is a stage which is movable three-dimensionally. Denoted at 12 and 13 are imaging optical systems, and denoted at 14 is Z-axis position measuring illuminating means. Denoted at 15 is image pickup means, and denoted at 16 is analog-to-digital (A/D) converting means. Denoted at 17 is integration means, and denoted at 18 is Z-axis position measuring means. The components from the imaging optical system to the Z-axis position measuring means 18, inclusive, are used for Z-axis position measurement. Denoted at 19 is light quantity measuring means, and denoted at 20 is contrast correcting means.

The process for detecting the focal point position in this embodiment is as follows.

Figure 2A:
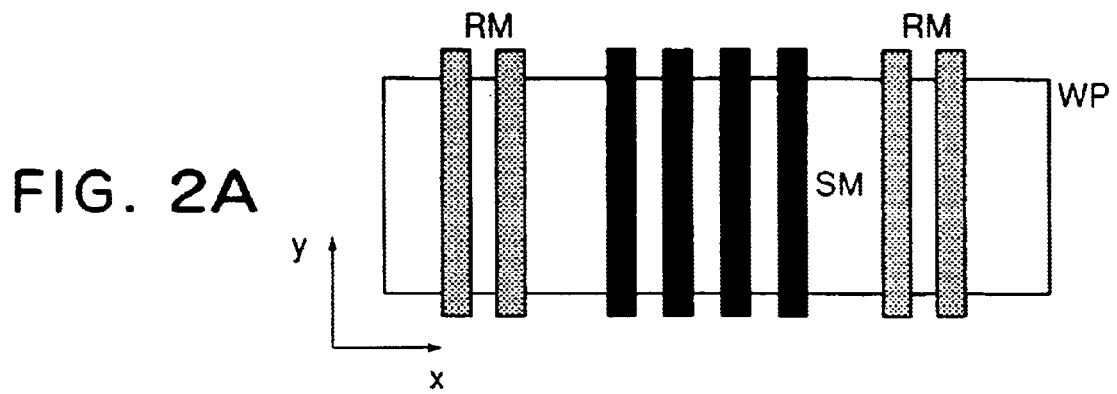
Figure 2B:
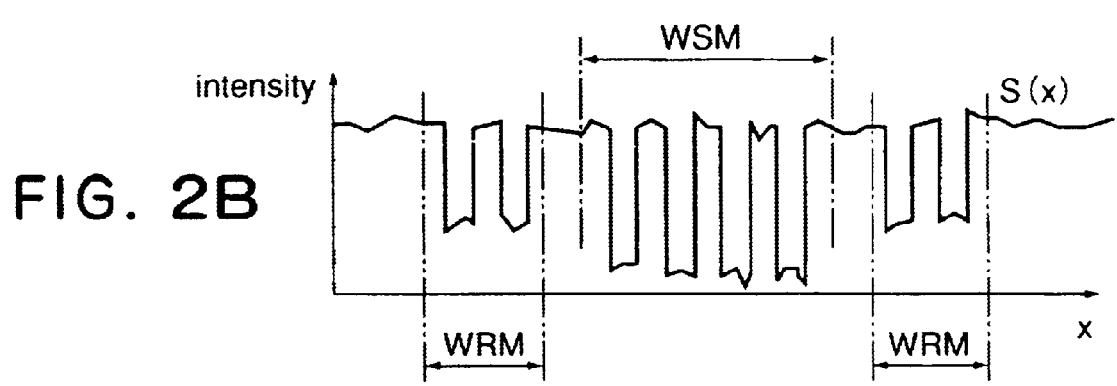
Figure 3A:
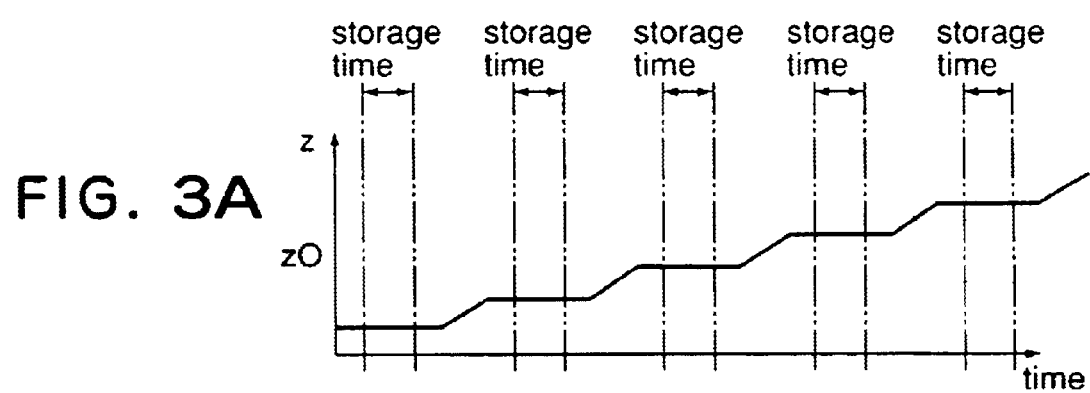
Figure 3B:
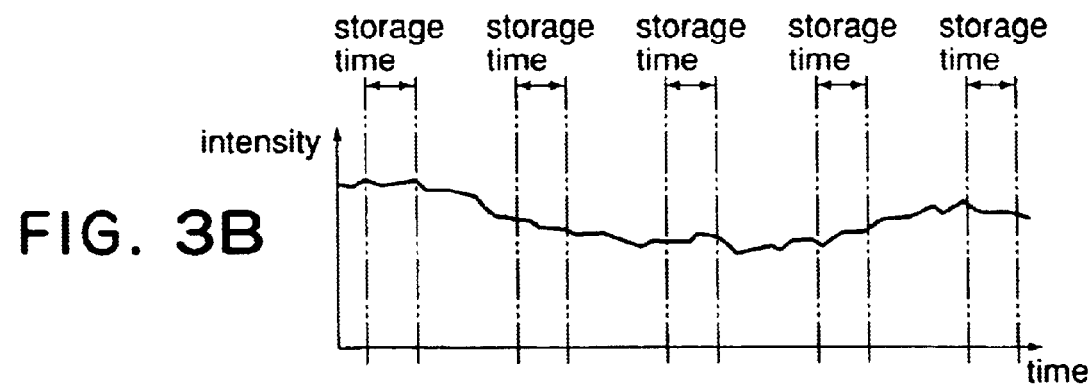
Figure 4A:
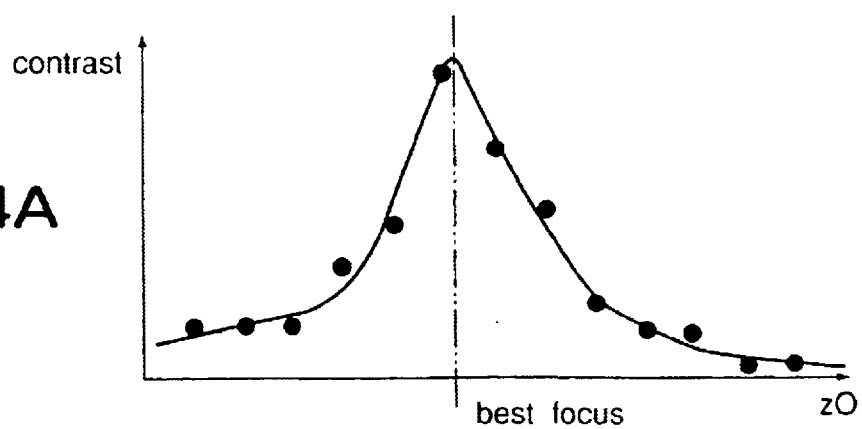
FIGS. 4A and 4B are graphs showing the relation between the Z-axis position and the reference mark contrast level, for explaining the manner of detecting the focal point position.
Figure 4B:
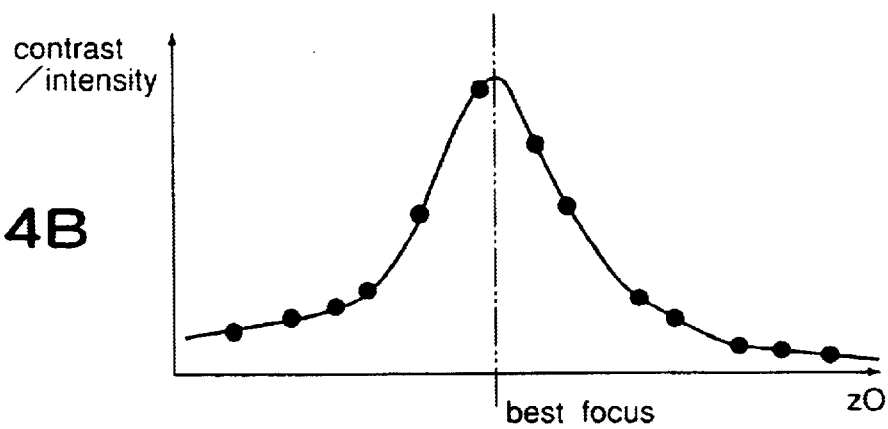

First, the stage 11 is moved to a position where a focal point position detecting mark provided on the stage can be observed. Initially, by use of a light beam emitted from the focal point position detecting illuminating means 2 which projects exposure light, the focal point position detecting mark (hereinafter, reference mark SM) is illuminated through the beam splitter 3, the reticle R and the projection optical system 1. FIG. 2A shows an image of the reference mark SM, and in this example it comprises plural patterns of the same shape. Light reflected by the reference mark SM goes through the projection optical system 1 and the reticle R once again, and it impinges on the beam splitter 3 and is reflected thereby. Then, through the imaging optical system 5, an image of the reference mark SM is formed on an image pickup surface Wp of the image pickup means 6. The image of the reference mark SM is then photoelectrically converted by the image pickup means 6. Thereafter, the reference mark SM image is converted by the A/D converting means 7 into a two-dimensional digital signal train. Denoted at 8 in FIG. 1 is integration means which performs integration processing with respect to the Y direction in FIG. 2A and functions to transform a two-dimensional signal into a one-dimensional digital signal train $S(x)$. By using the thus transformed digital signal train, the contrast calculating means 9 measures the contrast within the range of a reference mark measuring window WSM at the reference mark SM portion.

The contrast level or value may be a differentiation maximum value within the range of the reference mark measuring window WSM, for example. Also, by use of the light quantity measuring means 19, the light quantity is detected as the light intensity information in the image pickup, within the range of the reference mark measuring window WSM at the referenced mark SM portion. The light quantity may be a maximum value in the range of the reference mark measuring window WSM of the digital signal train $S(x)$ or, alternatively, it may be a value obtainable by subtracting a minimum value from a maximum value. Further, for improved reliability, an average may be taken with respect to a few picture elements around the maximum value and minimum value, and calculation may be done on the basis of the average. As regards the contrast level determined above, the contrast correcting means 20 performs standardization, by using equation (1) below, for example, for the light quantity. With this standardization, a corrected contrast value is calculated.

[differentiation maximum value within WSM of $S(x)$]/[maximum value in WSM—minimum value]     (1)

The operation described above is carried out plural times within a Z-axis range being expected to include the focus of the projection optical system. Plotting is done while taking the axis of the abscissa for the image-taking Z-axis position determined in advance and taking the axis of the ordinate for the reference mark corrected contrast level. Around a maximum contrast level portion, the Z-axis position which provides the largest contrast level is detected by means of curve fitting or gravity center calculation, for example. The thus detected position is taken as the focal point position (best focus) of the projection optical system.

It should be noted that the range of dispersion of the light quantity in image pickup, at respective movement positions of the stage 1, or variance ( ) thereof may be detected, and the contrast when this value is within a set range may be detected. If it is not so, the stage 11 position may be moved again, and the image pickup may be carried out again. Further, the stage 11 may not be moved from the initial position within the focal point position detecting range and, in place of it, the image pickup for the reference mark SM and the light quantity measurement may be repeated such that the detection of focal point position may be initiated after the dispersion and variance of the light quantity in image pickup come into a predetermined range.

[Second Embodiment]

A semiconductor manufacturing exposure apparatus in a second embodiment of the present invention will be described.

In FIG. 1, denoted at RS is a reticle stage, and denoted at R is a reticle. Denoted at RM is a reticle mark, and denoted at W is a wafer which is a substrate (plane object) to be exposed. Denoted at 1 is a projection optical system. Also, denoted at S is a focal point position detecting optical system, and denoted at 2 is focal point position detecting illuminating means. Denoted at 3 is a beam splitter, and denoted at 4 and 5 are imaging optical systems. Denoted at 6 is image pickup means, and denoted at 7 is analog-to-digital (A/D) converting means. Denoted at 8 is integration means, and denoted at 9 is contrast calculating means. Denoted at 10 is stage driving means, and denoted at 11 is a stage which is movable three-dimensionally. Denoted at 12 and 13 are imaging optical systems, and denoted at 14 is Z-axis position measuring illuminating means. Denoted at 15 is image pickup means, and denoted at 16 is analog-to-digital (A/D) converting means. Denoted at 17 is integration means, and denoted at 18 is Z-axis position measuring means. The components from the imaging optical system to the Z-axis position measuring means 18, inclusive, are used for Z-axis position measurement. Denoted at 19 is light quantity measuring means, and denoted at 20 is contrast correcting means.

The process for detecting the focal point position in this embodiment is as follows.

First, the stage 11 is moved to a position where a focal point position detecting mark provided on the stage can be observed. Initially, by use of a light beam emitted from the focal point position detecting illuminating means 2, which projects exposure light, the focal point position detecting mark (hereinafter, reference mark SM) is illuminated through the beam splitter 3, the reticle R and the projection optical system 1. FIG. 2A shows an image of the reference mark SM, and in this example it comprises plural patterns of the same shape. Light reflected by the reference mark SM goes through the projection optical system 1 and the reticle R once again, and it impinges on the beam splitter 3 and is reflected thereby. Then, through the imaging optical system 5, an image of the reference mark SM is formed on an image pickup surface Wp of the image pickup means 6. The image of the reference mark SM is then photoelectrically converted by the image pickup means 6. Thereafter, the reference mark SM image is converted by the A/D converting means 7 into a two-dimensional digital signal train. Denoted 8 in FIG. 1 is integration means, which performs integration processing with respect to the Y direction in FIG. 2A and it functions to transform a two-dimensional signal into a one-dimensional digital signal train $S(x)$. By using the thus transformed digital signal train, the contrast calculating means 9 measures the contrast within the range of a reference mark measuring window WSM at the reference mark SM portion.

The contrast level or value may be a differentiation maximum value within the range of the reference mark measuring window WSM, for example. Also, this embodiment uses reflection light from the reticle mark RM portion, other than the wafer W, which portion has substantially the same positional relation with respect to the mark image pickup optical system. Namely, by use of the light quantity measuring means 19, the light quantity is detected as the light intensity information in the image pickup, within the range of the reticle mark measuring window WRM at the reticle mark RM portion. The light quantity may be a maximum value in the range of the reticle mark measuring window WRM of the digital signal train $S(x)$ or, alternatively, it may be a value obtainable by subtracting a minimum value from a maximum value. Further, for improved reliability, an average may be taken with respect to a few picture elements around the maximum value and minimum value, and calculation may be done on the basis of the average. As regards the contrast level determined above, the contrast correcting means 20 performs standardization, by using equation (2) below, for example, for the light quantity. With this standardization, a corrected contrast value is calculated.

[differentiation maximum value within WSM of $S(x)$]/[maximum value in WRM—minimum value]  (2)

Since the positional relationship among the reticle mark RM, the projection optical system 1 and the focal point position detecting optical system S is unchanged during the focal point position scan, the light quantity in the image pickup can be evaluated more accurately.

The operation described above is carried out plural times within a Z-axis range being expected to include the focus of the projection optical system. Plotting is done while taking the axis of the abscissa for the image-taking Z-axis position determined in advance and taking the axis of the ordinate for the reference mark corrected contrast level. Around a maximum contrast level portion, the Z-axis position which provides the largest contrast level is detected by means of curve fitting or gravity center calculation, for example. The thus detected position is taken as the focal point position (best focus) of the projection optical system.

It should be noted that the range of dispersion of the light quantity in image pickup, at respective movement positions of the stage 1, or variance ( ) thereof may be detected, and the contrast when this value is within a set range may be detected. If it is not so, the stage 11 position may be moved again, and the image pickup may be carried out again. Further, the stage 11 may not be moved from the initial position within the focal point position detecting range and, in place of it, the image pickup for the reference mark SM and the light quantity measurement may be repeated such that the detection of focal point position may be initiated after the dispersion and variance of the light quantity in image pickup come into a predetermined range.

In the embodiment described above, the contrast level is detected and used for the detection of focal point position. However, it should be noted that the present invention is not limited to the use of a contrast value. A differentiation maximum value of a digital signal train $S(x)$, for example, may be used.

[Third Embodiment]

A semiconductor manufacturing exposure apparatus in a third embodiment of the present invention will be described.

Figure 5:
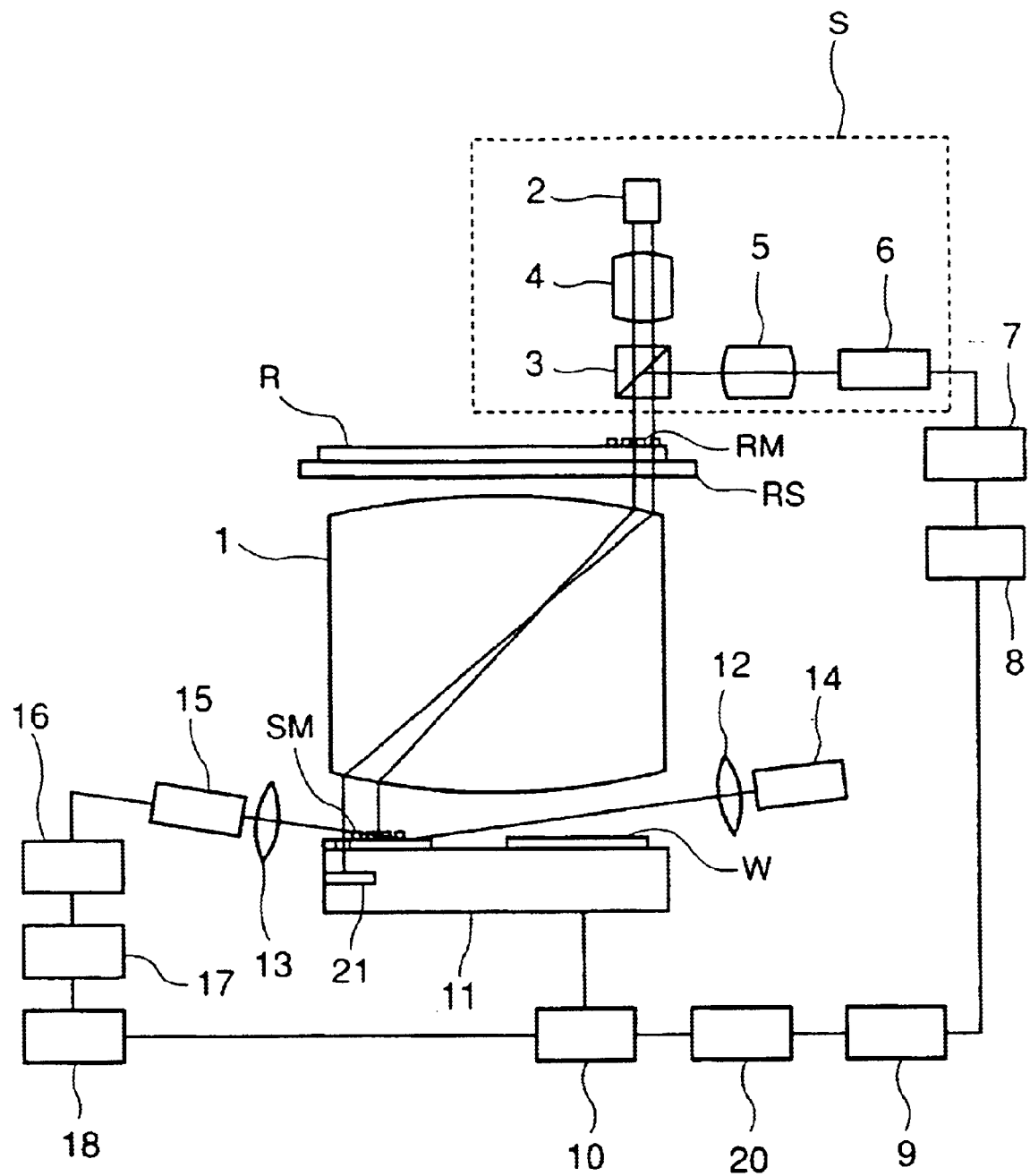
FIG. 5 is a schematic view of a semiconductor manufacturing exposure apparatus having a focal point position detecting system according to another embodiment of the present invention.
Figure 6:
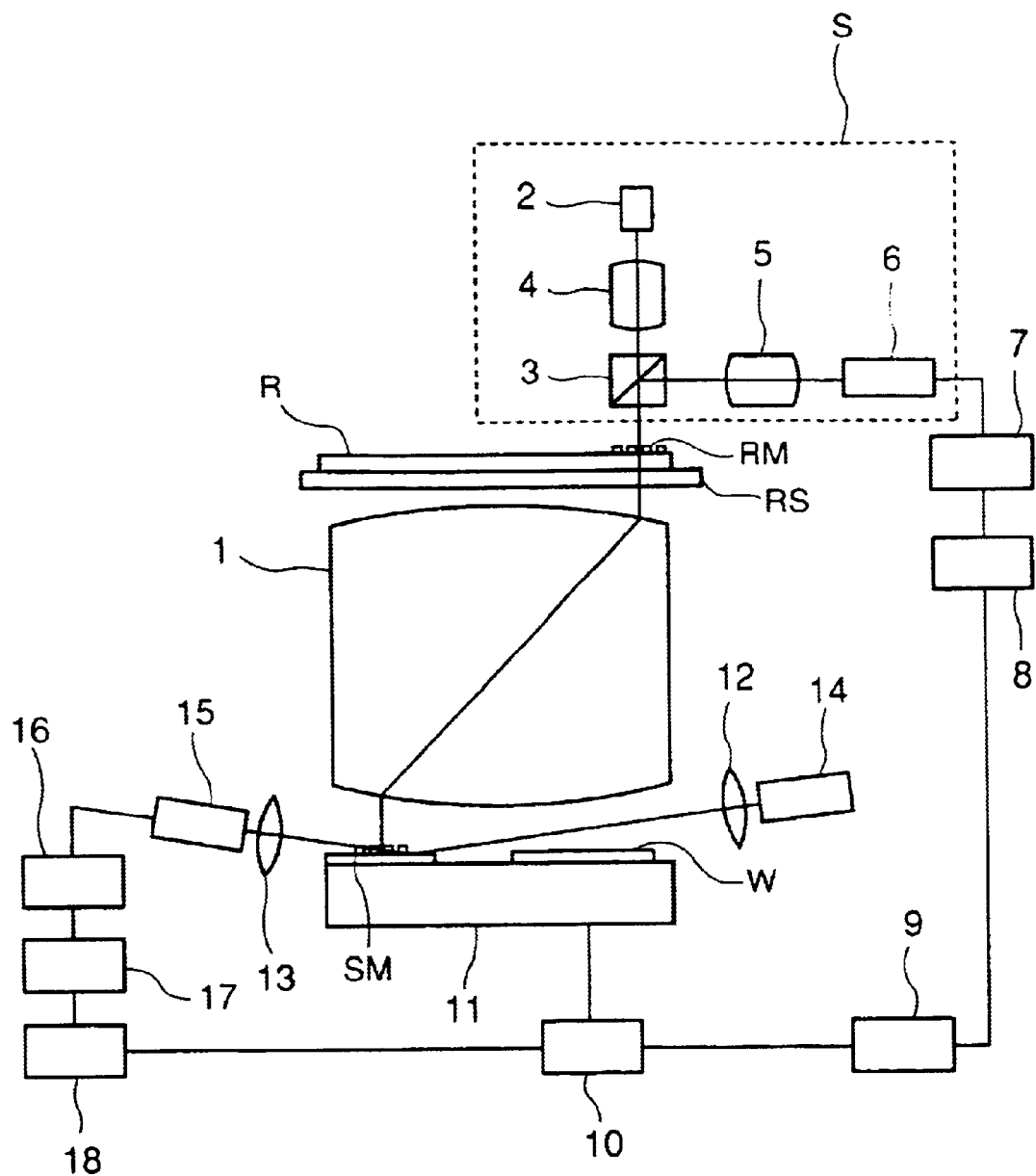
FIG. 6 is a schematic view of a typical example of a conventional structure.

In FIG. 5, denoted at RS is a reticle stage, and denoted at R is a reticle. Denoted at RM is a reticle mark, and denoted at W is a wafer which is a substrate to be exposed. Denoted at 1 is a projection optical system. Also, denoted at S is a focal point position detecting optical system, and denoted at 2 is focal point position detecting illuminating means. Denoted at 3 is a beam splitter, and denoted at 4 and 5 are imaging optical systems. Denoted at 6 is image pickup means, and denoted at 7 is analog-to-digital (A/D) converting means. Denoted at 8 is integration means, and denoted at 9 is contrast calculating means. Denoted at 10 is stage driving means, and denoted at 11 is a stage which is movable three-dimensionally. Denoted at 12 and 13 are imaging optical systems, and denoted at 14 is Z-axis position measuring illuminating means. Denoted at 15 is image pickup means, and denoted at 16 is analog-to-digital (A/D) converting means. Denoted at 17 is integration means, and denoted at 18 is Z-axis position measuring means. The components from the imaging optical system to the Z-axis position measuring means 18, inclusive, are used for Z-axis position measurement. Denoted at 20 is contrast correcting means, and denoted at 21 is a light quantity measuring sensor, which is mounted on the stage 11. The sensor 21 is provided to measure the light intensity at the reference mark SM on the wafer at the image pickup operation.

The process for detecting the focal point position in this embodiment is as follows.

First, the stage 11 is moved to a position where a focal point position detecting mark SM provided on the stage can be observed. Initially, by use of a light beam emitted from the focal point position detecting illuminating means 2 which projects exposure light, the focal point position detecting mark (hereinafter, reference mark SM) is illuminated through the beam splitter 3, the reticle R and the projection optical system 1. FIG. 2A shows an image of the reference mark SM, and in this example it comprises plural patterns of the same shape. Light reflected by the reference mark SM goes through the projection optical system 1 and the reticle R once again, and it impinges on the beam splitter 3 and is reflected thereby. Then, through the imaging optical system 5, an image of the reference mark SM is formed on an image pickup surface Wp of the image pickup means 6. The image of the reference mark SM is then photoelectrically converted by the image pickup means 6. Thereafter, the reference mark SM image thus picked up is converted by the A/D converting means 7 into a two-dimensional digital signal train. Denoted 8 in FIG. 5 is integration means, which performs integration processing with respect to the Y direction in FIG. 2A and it functions to transform a two-dimensional signal into a one-dimensional digital signal train S(x). By using the thus transformed digital signal train, the contrast calculating means 9 measures the contrast within the range of a reference mark measuring window WSM at the reference mark portion.

The contrast level or value may be a differentiation maximum value within the range of the reference mark measuring window WSM, for example. Also, by use of the light quantity measuring sensor 21 provided on the stage 1, the light quantity at the image pickup operation is measured in advance, whereby an actually measured value is obtained. As regards the contrast level determined above, the contrast correcting means 20 performs standardization, by using equation (3) below, for example, for the light quantity. With this standardization, a corrected contrast value is calculated.

$$[\text{differentiation maximum value within WSM of } S(x)]/[\text{light quantity detected by light quantity measuring sensor}] \quad (3)$$

The operation described above is carried out plural times within a Z-axis range being expected to include the focus of the projection optical system. Plotting is done while taking the axis of the abscissa for the image-taking Z-axis position determined in advance and taking the axis of the ordinate for the reference mark corrected contrast level. Around a maximum contrast level portion, the Z-axis position, which provides the largest contrast level is detected by means of curve fitting or gravity center calculation, for example. The thus detected position is taken as the focal point position of the projection optical system.

It should be noted that the range of dispersion of the light quantity in image pickup, at respective movement positions of the stage 1, or variance ( ) thereof may be detected, and the contrast when this value is within a set range may be detected. If it is not so, the stage 11 position may be moved again, and the image pickup may be carried out again. Further, the stage 11 may not be moved from the initial position within the focal point position detecting range and, in place of it, the image pickup for the reference mark SM and the light quantity measurement may be repeated such that the detection of focal point position may be initiated after the dispersion and variance of the light quantity in image pickup come into a predetermined range.

In the embodiment described above, the contrast level is detected and used for the detection of focal point position. However, it should be noted that the present invention is not limited to the use of a contrast value. A differentiation maximum value of a digital signal train S(x), for example, may be used.

[Embodiment of A Semiconductor Manufacturing System]

Next, an embodiment of a manufacturing system for semiconductor devices such as semiconductor chips (e.g., ICs or LSIs), liquid crystal panels, CCDs, thin film magnetic heads, or micro-machines, for example, will be described. This system is arranged so that repair of any disorder occurring in a production machine placed in a semiconductor manufacturing factory or periodic maintenance thereof or, alternatively, a maintenance service such as software supply, can be made by use of a computer network outside the manufacturing factory.

Figure 7:
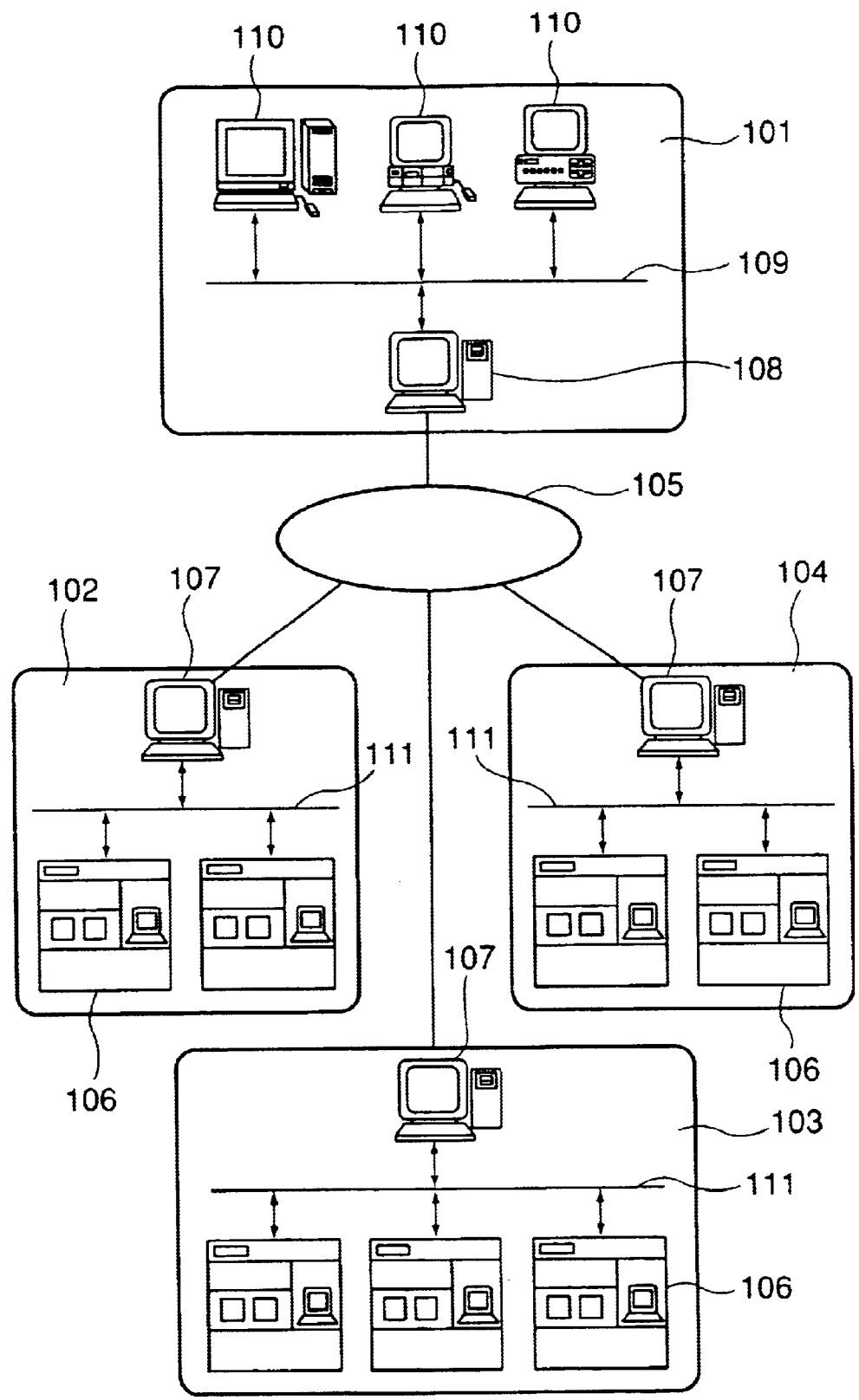
FIG. 7 is a schematic view of a semiconductor device manufacturing system, as viewed in a certain aspect thereof.

FIG. 7 is a schematic view of a general structure of the production system, in a certain aspect thereof. Denoted in the drawing at 101 is a business office of a vendor (e.g., a machine supplier) for providing semiconductor device manufacturing apparatuses. As examples of such production machines, here, pre-process machines (e.g., various lithographic apparatuses such as an exposure apparatus, a resist coating apparatus, an etching apparatus, for example, as well as a heat treatment apparatus, a film forming apparatus, and a flattening apparatus) and post-process machines (e.g., an assembling machine and an inspection machine, for example) are assumed. Inside the business office 101, there are a host control system 108 for providing a maintenance database for the production machines, plural operating terminal computers 110, and a local area network (LAN) 109 for connecting them to constitute an intranet. The host control system 108 is provided with a gateway for connecting the LAN 109 to an internet 105, which is an outside network of the office, and a security function for restricting the access from the outside.

On the other hand, denoted at 102–104 are plural manufacturing factories of a semiconductor manufacturer or manufacturers as a user (users) of production machines. The factories 102–104 may belong to different manufacturers or to the same manufacturer (e.g., they may be a pre-process factory and a post-process factory). In each of the factories 102–104, there are production machines 106, a local area network (LAN) 111 for connecting them to constitute an intranet, and a host control system 107 as a monitoring system for monitoring the state of operation of the production machines 106. The host control system 107 in each factory 102–104 is provided with a gateway for connecting the LAN 111 in the factory to the interact 105, which is an outside network of the factory. With this structure, the host control system 108 of the vendor 101 can be accessed from the LAN 111 in each factory, through the internet 105. Further, due to the security function of the host control system 108, only admitted users can obtain access thereto. More specifically, through the internet 105, status information representing the state of operation of the production machines 106 (for example, the state of the machine in which any disorder has occurred) may be transmitted as a notice from the factory to the vendor. Additionally, any response information, which is responsive to the notice (that is, for example, information on how the disorder should be treated or software data concerning the treatment), as well as a latest software program and maintenance information such as help information, may be supplied from the vendor. The data communication between each factory 102–104 and the vendor 101 as well as the data communication through the LAN 111 in each factory, may use a communication protocol (TCP/IP) generally used in the internet. In place of using the internet, an exclusive line network (e.g., an ISDN) controlled with strictest security that an access of a third party is not allowed, may be used. Further, the host control system is not limited to the system as provided by the vendor. A database may be structured by the user and it may be set in an outside network, such that it can be accessed from plural user factories.

Figure 8:
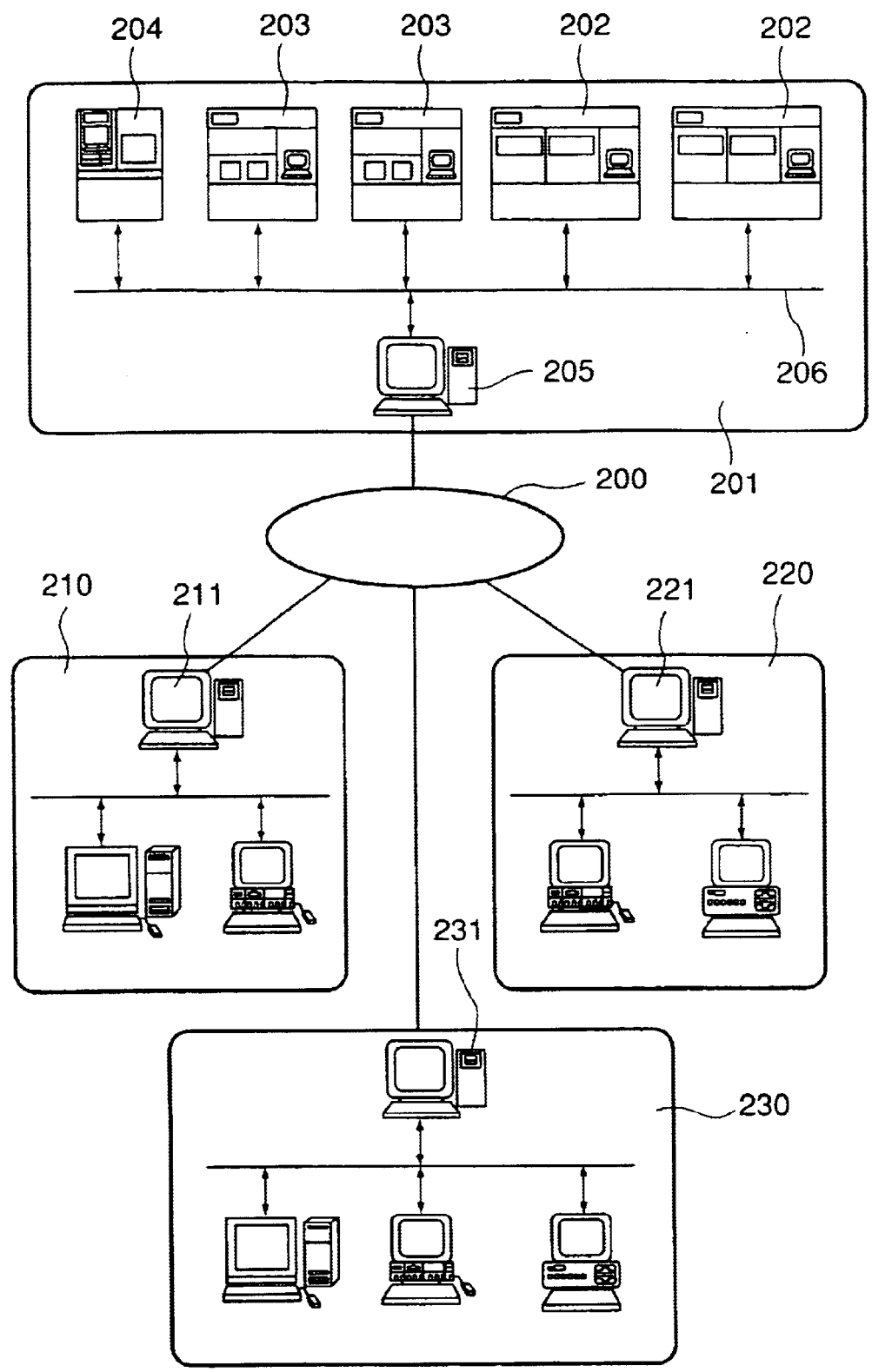
FIG. 8 is a schematic view of a semiconductor device manufacturing system, as viewed in another aspect thereof.

FIG. 8 is a schematic view of a general structure of the production system according to this embodiment, in another aspect thereof different from that of the one shown in FIG. 7. In the preceding example, plural user factories each having production machines and the control system of the vendor of the production machines are connected with each other through an external network, so that, through this external network, information related to the production control in each factory or information related to at least one production machine can be data communicated. In this example, as compared therewith, a factory having production machines supplied from different vendors and control systems of these vendors corresponding to the user production machines are connected with each other through an external network, outside the factory, so that the maintenance information for these production machines can be data communicated.

Denoted in the drawing at 201 is a manufacturing factory of a production machine user (i.e., a semiconductor device manufacturer). Along the production line in the factory, there are many production machines for performing various processes, that is, in this example, an exposure apparatus 202, a resist processing apparatus 203, and a film formation processing apparatus 204 introduced. Although only one factory 201 is illustrated in the drawing, in practice, plural factories may be arranged into the network. Each production machine in the factory is connected through a LAN 206 to constitute an intranet. The operation of the production line is controlled by a host control system 205.

On the other hand, in the business offices of vendors (machine supplying makers) such as an exposure apparatus manufacturer 210, a resist processing machine manufacturer 220, and a film forming machine manufacturer 230, for example, there are host control systems 211, 221 and 213 for performing remote control maintenance for the machines they supplied. Each of these host control systems is equipped with a maintenance database and a gateway for the outside network. The host control system 205 for controlling the machines in the user factory and the control systems 211, 221 and 231 of the machine vendors are connected with each other through the external network 200 (internet) or an exclusive line network. If, in this production system, any disorder occurs in any one of the production machines in the production line, the operation of the production machine is stopped. However, this can be met quickly through the remote control maintenance for the disordered machine, from the corresponding machine vendor and by way of the internet 200. Therefore, the suspension of the production line is short.

Figure 9:
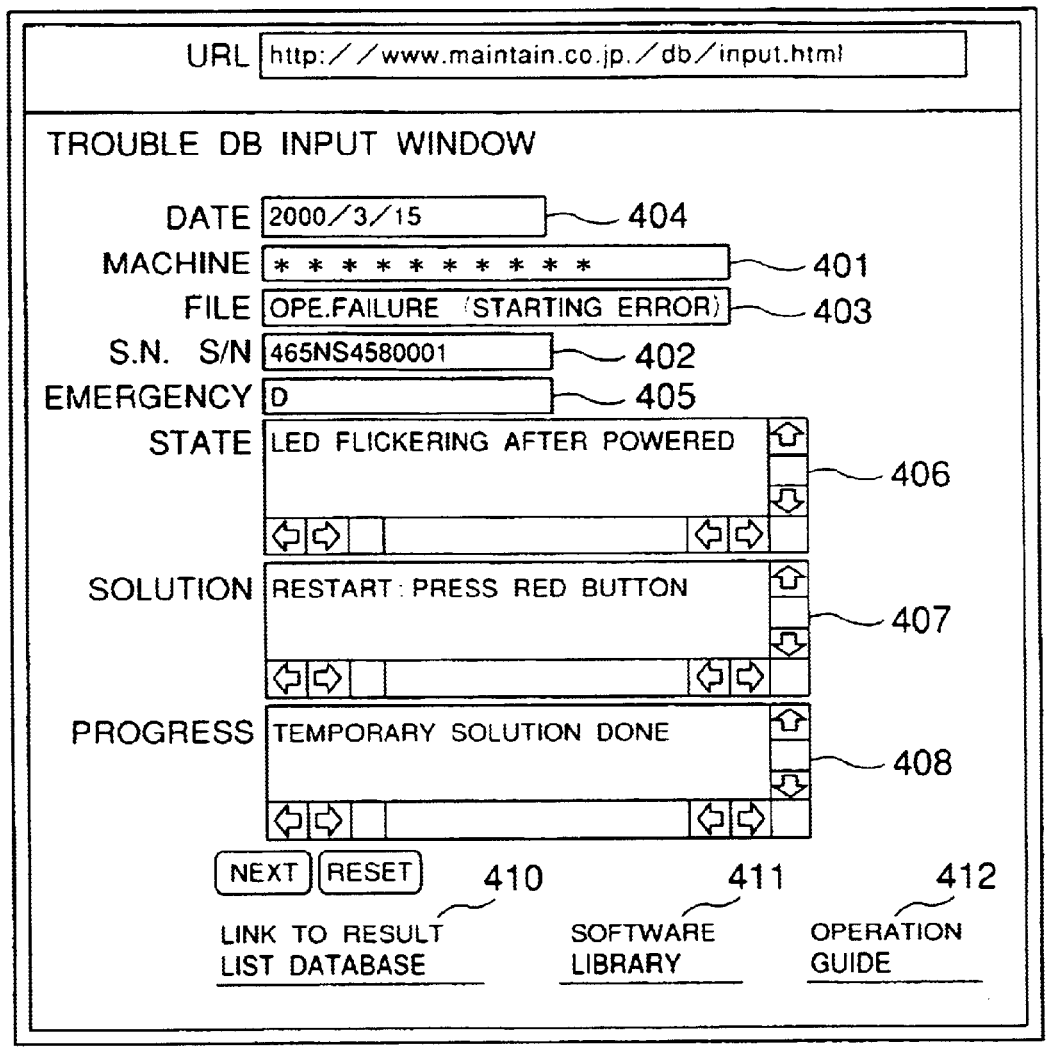
FIG. 9 is a schematic view for explaining an example of a user interface.

Each of the production machines in the factory may have a display, a network interface and a computer for executing network accessing software, stored in a storage device, as well as machine operating software. The storage device may be an internal memory or a hard disk or, alternatively, it may be a network file server. The network accessing software may include an exclusive or wide-use web browser, and a user screen interface such as shown in FIG. 9, for example, may be provided on the display. Various data may be inputted into the computer (input zones on the screen) by an operator who controls the production machines in each factory, such as, for example, machine type (401), serial number (402), trouble file name (403), date of disorder (404), emergency level (405), status (406), solution or treatment (407), and progress (408). The thus inputted information is transmitted to the maintenance database through the internet. In response, appropriate maintenance information is sent from the maintenance database to the user's display. Further, the user interface as provided by the web browser enables a hyperlink function (410–412) as illustrated. As a result, the operator can access further details of information in each items, or he/she can get latest version software to be used for the production machine, from the software library as provided by the vendor. Alternatively, the operator can get an operation guide (help information) prepared for factory operators. Here, the maintenance information provided by the maintenance database may include information related to the present invention as described above, and the aforementioned software library may provide latest software necessary for accomplishing the present invention.

Next, a semiconductor device manufacturing process, which uses the production system described above, will be explained.

Figure 10:
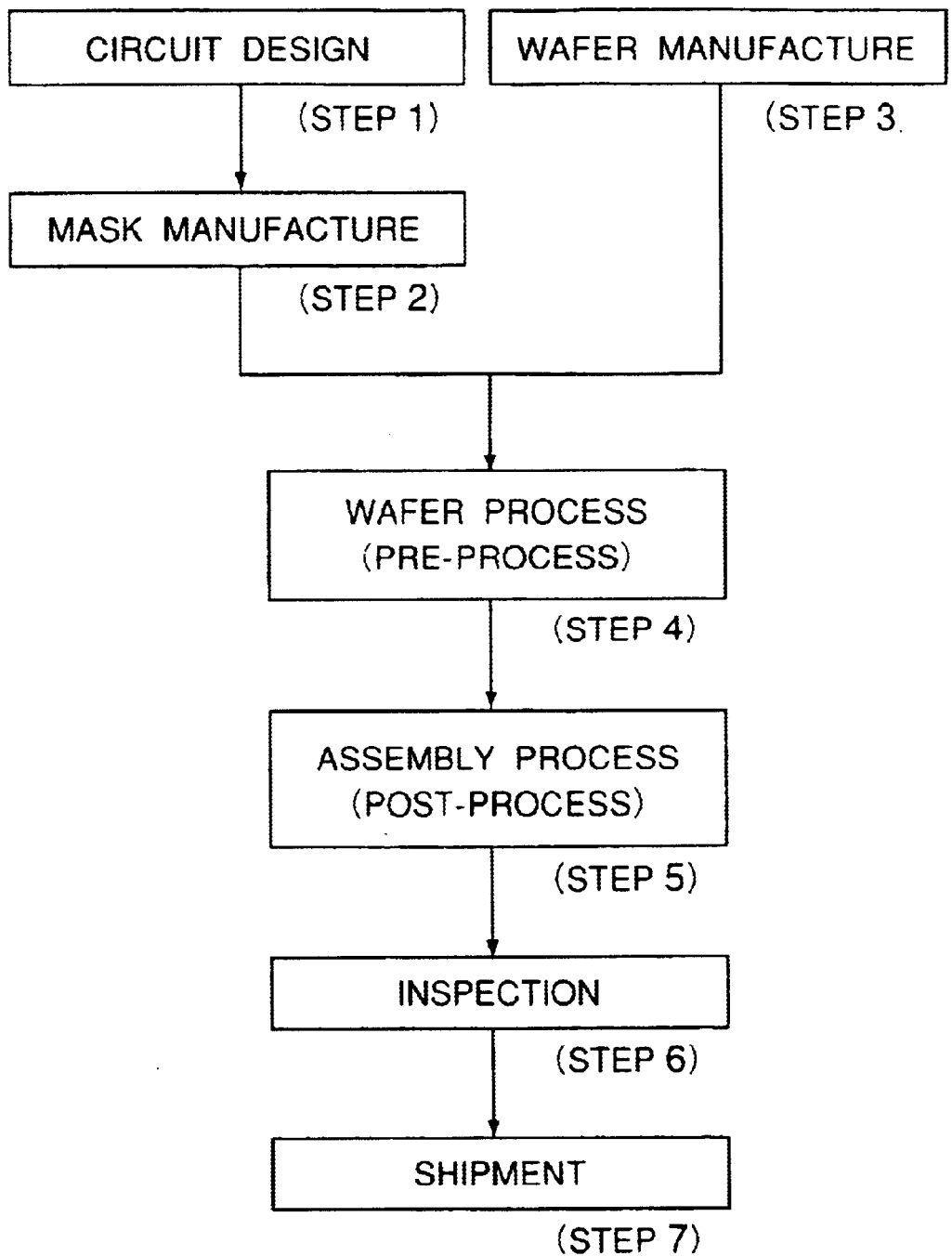
FIG. 10 is a flow chart of device manufacturing processes.

FIG. 10 is a flow chart of a general procedure for the manufacture of microdevices.

Step 1 is a design process for designing a circuit of a semiconductor device. Step 2 is a process for making a mask on the basis of the circuit pattern design. Step 3 is a process for preparing a wafer by using a material such as silicon. Step 4 is a wafer process (called a pre-process) wherein, by using the so prepared mask and wafer, circuits are practically formed on the wafer through lithography. Step 5 subsequent to this is an assembling step (called a post-process) wherein the wafer having been processed by step 4 is formed into semiconductor chips. This step includes an assembling (dicing and bonding) process and a packaging (chip sealing) process. Step 6 is an inspection step wherein an operation check, a durability check, and so on, for the semiconductor devices provided by step 5, are carried out. With these processes, semiconductor devices are completed and they are shipped (step 7).

The pre-process and the post-process may be performed in separate exclusive factories. In each factory, the maintenance is carried out on the basis of the remote maintenance system described hereinbefore. Further, between the pre-process factory and the post-process factory, data communication for the information related to the production control and the machine maintenance may be done by use of the internet or an exclusive line network.

Figure 11:
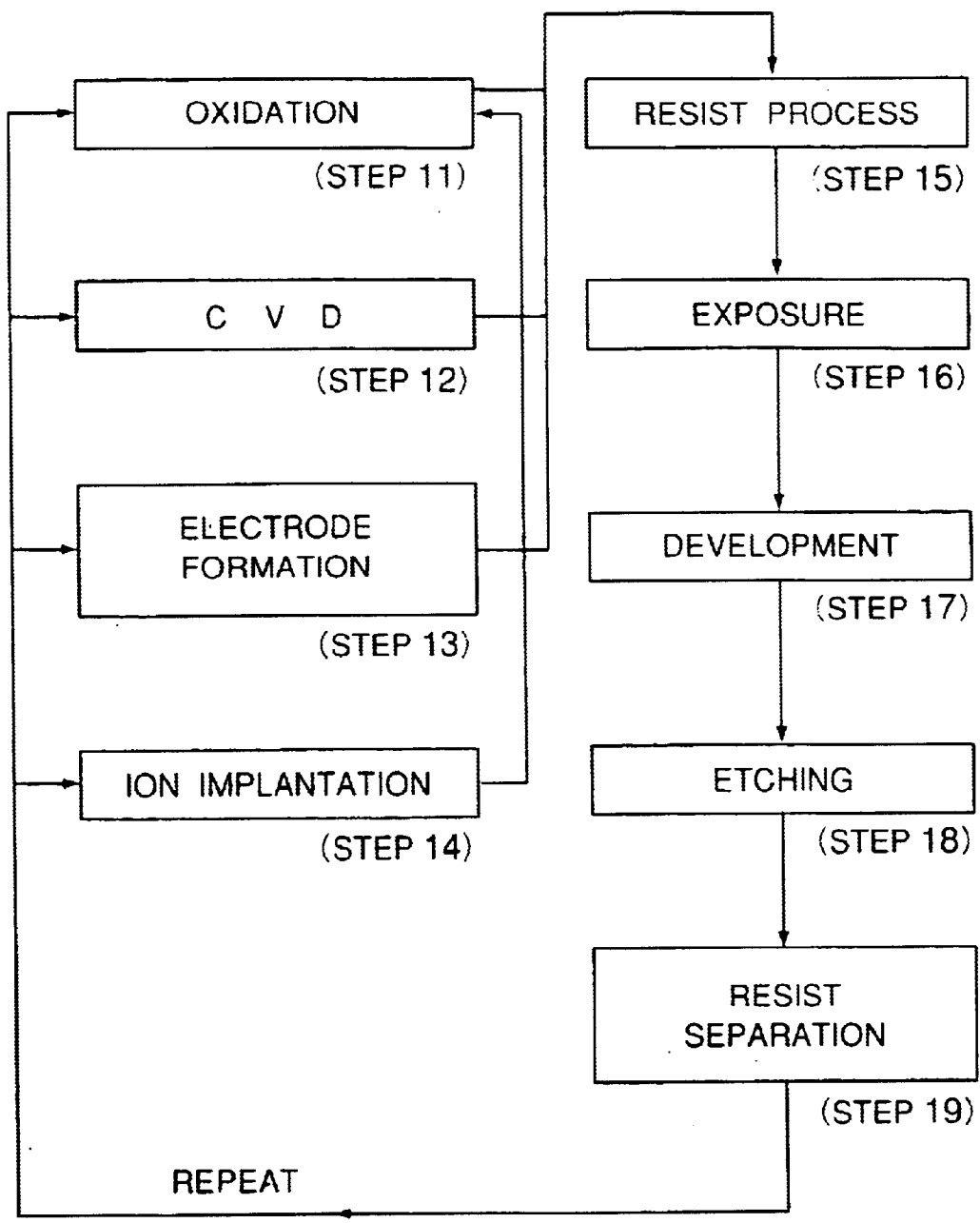
FIG. 11 is a flow chart for explaining details of a wafer process.

FIG. 11 is a flow chart showing details of the wafer process.

Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

Since the machines used in these processes are maintained through a remote maintenance system as described above, any disorder may be prevented beforehand. If it occurs, it can be met quickly. Therefore, the device productivity can be improved significantly.

In accordance with the present invention as described hereinbefore, the influence of a change in intensity of illumination light at the time of reference mark image pickup upon the focus measurement can be reduced significantly, such that more accurate detection of focal point position is enabled. Further, since in the present invention the contrast and the light quantity are detected from the same signal train, it is less affected by external disturbance. Thus, accurate contrast correction is enabled, additionally. Similar advantageous effects are provided even in a semiconductor manufacturing exposure apparatus.

While the invention has been described with reference to the structures disclosed herein, it is not confined to the details set forth and this application is intended to cover such modifications or changes as may come within the purposes of the improvements or the scope of the following claims.

What is claimed is:

1. A method of detecting a focal point position of a projection optical system, said method comprising steps of:
   moving an object having a first mark in a direction of an optical axis of the projection optical system;
   illuminating the first mark with light;
   taking an image of the illuminated first mask through the projection optical system, using an image pickup unit, with respect to each position of the object;
   calculating a contrast-related value relating to contrast of a first signal corresponding to the first mark in each of the images;
   measuring an intensity of the light with respect to each of the images, based on a second signal different from the first signal;
   correcting the contrast-related value of each of the images, based on the corresponding intensity of the light; and
   detecting the focal point position, based on the corrected contrast-related value of each of the images.

2. A method according to claim 1, wherein the second signal corresponds to a second part different from a first part corresponding to the first mark in each of the images.

3. A method according to claim 1, wherein each of the images is taken through a second mark positioned between the projection optical system and the image pickup unit in said taking step, and wherein the second signal corresponds to the second mark in each of the images.

4. A method according to claim 1, wherein the second signal is obtained using a light quantity measuring sensor.

5. A method according to claim 1, wherein the object is moved using a movable stage unit on which the object is placed in said moving step, and wherein the second signal is obtained using a light quantity measuring sensor arranged in the movable stage unit.

6. A method according to claim 1, wherein the contrast-related value is corrected by dividing the contrast-related value by the corresponding intensity of the light in said correcting step.

7. A method according to claim 1, further comprising a step of obtaining dispersion of intensities of the light, wherein the process of said method is controlled based on the obtained dispersion.

8. An apparatus for detecting a focal point position of a projection optical system, comprising:
   a moving unit which moves an object having a first mark in a direction of an optical axis of the projection optical system;
   an illumination unit which illuminates the first mark with light;
   a taking unit, including an image pickup unit, which takes an image of the illuminated first mark through the projection optical system with respect to each position of the object;
   a calculating unit which calculates a contrast-related value relating to contrast of a first signal corresponding to the first mark in each of the images;
   a measuring unit which measures an intensity of the light with respect to each of the images, based on a second signal different from the first signal;
   a correction unit which corrects the contrast-related value of each of the images based on the corresponding intensity of the light; and
   a detecting unit which detects the focal point position based on the corrected contrast-related value of each of the images.

9. An apparatus according to claim 8, wherein the second signal corresponds to a second part different from a first part corresponding to the first mark in each of the images.

10. An apparatus according to claim 8, wherein said taking unit takes each of the images through a second mark positioned between the projection optical system and said image pickup unit, and wherein the second signal corresponds to the second mark in each of the images.

11. An apparatus according to claim 8, further comprising a light quantity measuring sensor which obtains the second signal.

12. An apparatus according to claim 8, wherein said moving unit includes a movable stage unit on which the object is placed, and wherein said apparatus further comprises a light quantity measuring sensor, arranged in the movable stage unit and obtaining the second signal.

13. An apparatus according to claim 8, wherein said correcting unit corrects the contrast-related value by dividing the contrast-related value by the corresponding intensity of the light.

14. An apparatus according to claim 8, further comprising an obtaining unit which obtains dispersion of intensities of the light, and a control unit which controls operation of said apparatus based on the obtained dispersion.

15. An exposure apparatus for exposing a substrate to a pattern through a projection optical system, said exposure apparatus comprising an apparatus as defined in claim 8.

16. A device manufacturing method comprising a step of exposing a substrate to a pattern through a projection optical system using an exposure apparatus as defined in claim 15.

* * * * *

UNITED STATES PATENT AND TRADEMARK OFFICE
CERTIFICATE OF CORRECTION

PATENT NO.      : 6,762,825 B2
DATED           : July 13, 2004
INVENTOR(S)     : Nozomu Hayashi et al.

It is certified that error appears in the above-identified patent and that said Letters Patent is hereby corrected as shown below:

<u>Title page,</u>
Item [57], ABSTRACT,
Line 10, "tot" should read -- to --.

<u>Column 3,</u>
Line 48, "the-light" should read -- the light --.

<u>Column 4,</u>
Line 42, "factory," should read -- factory; --.

<u>Column 8,</u>
Line 62, "2 is" should read -- 2 is a --.

<u>Column 9,</u>
Line 36, "Denoted" should read -- Denoted at --.
Line 47, "stage 1," should read -- stage 11, --.

<u>Column 10,</u>
Line 63, "interact" should read -- internet --.

<u>Column 12,</u>
Line 25, "items," should read -- item, --.

Signed and Sealed this

Twenty-second Day of March, 2005

JON W. DUDAS
*Director of the United States Patent and Trademark Office*